United States Patent
Collins et al.

(10) Patent No.: US 10,968,352 B2
(45) Date of Patent: Apr. 6, 2021

(54) NITRIDE FREE VAPOR DEPOSITED CHROMIUM COATING

(71) Applicant: United Technologies Corporation, Farmington, CT (US)

(72) Inventors: Kevin L. Collins, Mansfield, TX (US); Michael J. Minor, Mansfield, TX (US)

(73) Assignee: Raytheon Technologies Corporation, Farmington, CT (US)

(*) Notice: Subject to any disclaimer, the term of this patent is extended or adjusted under 35 U.S.C. 154(b) by 87 days.

(21) Appl. No.: 16/036,075

(22) Filed: Jul. 16, 2018

(65) Prior Publication Data

US 2018/0319998 A1     Nov. 8, 2018

Related U.S. Application Data

(63) Continuation of application No. 14/597,263, filed on Jan. 15, 2015, now Pat. No. 10,023,749.

(51) Int. Cl.
| | |
|---|---|
| *C09D 5/08* | (2006.01) |
| *C23C 10/10* | (2006.01) |
| *C23C 10/32* | (2006.01) |
| *C23C 16/06* | (2006.01) |
| *C23C 16/44* | (2006.01) |
| *F01D 5/28* | (2006.01) |

(52) U.S. Cl.
CPC ............... *C09D 5/08* (2013.01); *C23C 10/10* (2013.01); *C23C 10/32* (2013.01); *C23C 16/06* (2013.01); *C23C 16/44* (2013.01); *F01D 5/288* (2013.01)

(58) Field of Classification Search
None
See application file for complete search history.

(56) References Cited

U.S. PATENT DOCUMENTS

| | | | |
|---|---|---|---|
| 3,874,901 A | 4/1975 | Rairden, III | |
| 5,194,219 A | 3/1993 | Baldi | |
| 8,124,246 B2* | 2/2012 | Tolpygo | C23C 10/02 416/241 R |
| 2006/0093849 A1* | 5/2006 | Farmer | C23C 10/28 428/651 |
| 2007/0116875 A1* | 5/2007 | Cetel | F01D 5/288 427/252 |
| 2010/0124670 A1 | 5/2010 | Tolpygo | |
| 2012/0090736 A1 | 4/2012 | Tolpygo | |
| 2013/0115097 A1 | 5/2013 | Berger | |
| 2014/0004372 A1 | 1/2014 | Collins et al. | |

FOREIGN PATENT DOCUMENTS

| | | |
|---|---|---|
| EP | 1 788 125 A2 | 5/2007 |
| EP | 2975153 A2 | 1/2016 |
| GB | 2 421 032 A | 6/2006 |

OTHER PUBLICATIONS

European office action for patent application No. 15195814.7 dated Jan. 18, 2018.

(Continued)

*Primary Examiner* — Daniel J. Schleis
(74) *Attorney, Agent, or Firm* — Bachman & LaPointe, PC

(57) ABSTRACT

A process for applying a chromium layer on a substrate, specifically a turbine engine airfoil, by contacting at least a portion of the substrate with a gaseous chromium wherein the gaseous chromium is generated from a substantially nitrogen free source.

7 Claims, 4 Drawing Sheets

(56) References Cited

OTHER PUBLICATIONS

European search report for Application No. 15195814.7-1362 dated May 23, 2016.
United States office action for patent application U.S. Appl. No. 14/597,263 dated Jun. 15, 2016.
United States office action for U.S. Appl. No. 14/597,263 dated Dec. 12, 2016.
United States office action for U.S. Appl. No. 14/597,263 dated Oct. 30, 2017.
United States office action for U.S. Appl. No. 14/597,263 dated May 23, 2017.
Ledoux, Xavier, et al., "Development of chromium and aluminum coatings and superalloys by pack-cementation technique"_ Advanced Materials Research, 1662-8985, vol. 278, pp. 491-496.
Pytel, M., et al. "Thermal stability of protective coatings produced on nickel based superalloy." Journal of Achievements in Materials and Manurfacturing Engineering 51/2 (2012) 67-77.
Streiff, R., et al., "Corrosion Resistant Modified Aluminide Coatings". J. Mater. Eng. (1988) 10:15-26.
European office action for patent application No. 15195814.7 dated Aug. 5, 2020.

* cited by examiner

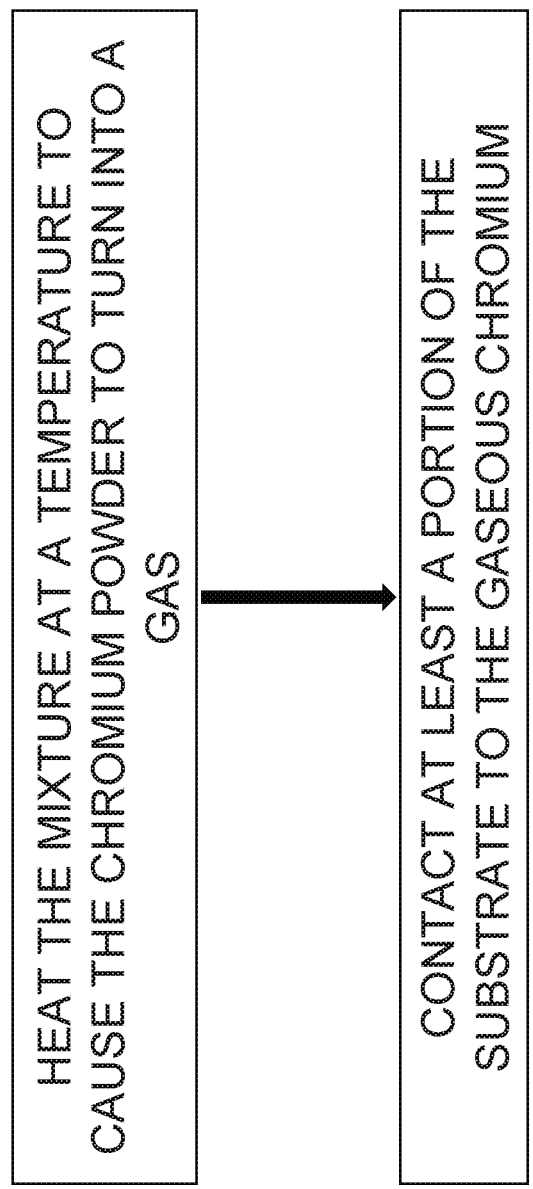

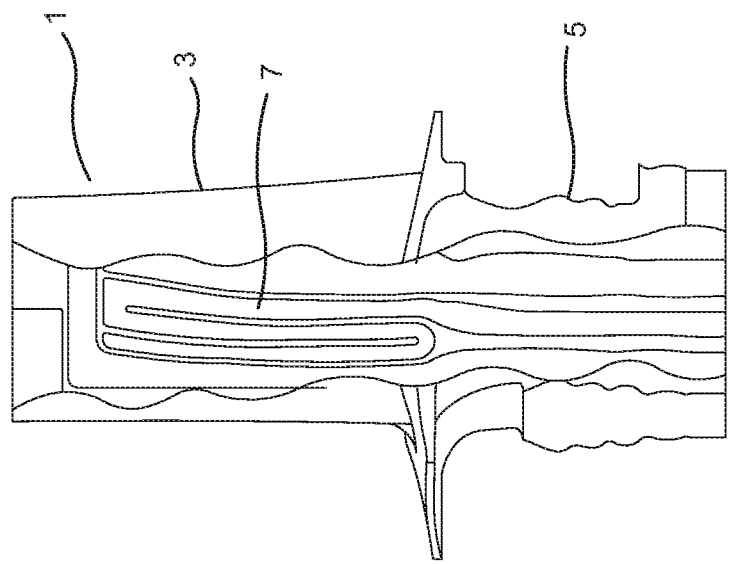

NITRIDE FREE VAPOR DEPOSITED CHROMIUM COATING

CROSS REFERENCE TO RELATED APPLICATIONS

This application is a continuation application of U.S. patent application of Ser. No. 14/597,263 filed Jan. 15, 2015.

BACKGROUND OF THE INVENTION

This disclosure relates to improvements in forming chromium diffusion coatings.

Substrates that are subject to corrosion, such as gas turbine engine components, may include a coating to protect an underlying material from corrosion. Vapor deposition techniques can be used to deposit chromium for diffusion into the underlying material. However, typically these techniques use gases and activators that tend to include or form nitrides. Nitrides can have a negative effect on corrosion protection and have to be removed prior to entry of the substrate into service. However, the processes used for the removal of the nitride layer can damage the substrates. The need exists for a way to address nitride deposition issues without stressing and potentially damaging the parts.

SUMMARY OF THE INVENTION

According to the disclosure, a method is provided of applying a chromium layer on a substrate by diffusion wherein the layer is substantially nitrogen free.

A process for applying a chromium layer on a substrate comprises: contacting at least a portion of a substrate with a vapor comprising a gaseous chromium wherein the gaseous chromium is generated from a mixture comprising a chromium source and a substantially nitrogen free activator.

In a further non-limiting embodiment of any of the foregoing examples, the chromium diffuses into the portion of the substrate to define the chromium layer.

In a further non-limiting embodiment of any of the foregoing examples, the mixture comprises a chromium solid.

In a further non-limiting embodiment of any of the foregoing examples, the contacting step takes place in an enclosed space.

In a further non-limiting embodiment of any of the foregoing examples, the mixture is heated to produce gaseous chromium.

In a further non-limiting embodiment of any of the foregoing examples, the substrate is an aircraft engine airfoil.

In a further non-limiting embodiment of any of the foregoing examples, the airfoil is a high pressure turbine stage airfoil.

In a further non-limiting embodiment of any of the foregoing examples, the airfoil is a low pressure turbine stage airfoil.

In a further non-limiting embodiment of any of the foregoing examples, conditions inside the enclosed space are between 1900° F. and 2000° F.

In a further non-limiting embodiment of any of the foregoing examples, conditions inside the enclosed space are held between 4 and 20 hours.

In a further non-limiting embodiment of any of the foregoing examples, the chromium layer has a thickness of between 0.3 and 1.3 mil (7.62-33.02 microns).

In a further non-limiting embodiment of any of the foregoing examples, the activator is a halide compound.

In a further non-limiting embodiment of any of the foregoing examples, the activator is a nitride free chloride compound.

In a further non-limiting embodiment of any of the foregoing examples, the activator is selected from the group consisting of chromium III chloride and chromium II chloride.

In a further non-limiting embodiment of any of the foregoing examples, the ratio of chromium to activator is between 120:1 and 160:1.

In a further non-limiting embodiment of any of the foregoing examples, the substrate has internal passageways.

In a further non-limiting embodiment of any of the foregoing examples, the portion includes the internal passageways.

In a further non-limiting embodiment of any of the foregoing examples, the chromium layer covers the internal passageways.

In a further non-limiting embodiment of any of the foregoing examples, the substrate is made of a nickel-based superalloy.

In a further non-limiting embodiment of any of the foregoing examples, relative to a total combined weight of the chromium, and the chromium chloride, the mixture has 98-99% by weight of chromium, and 1-2% by weight of chromium chloride.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

The various features and advantages of the present disclosure will become apparent to those skilled in the art from the following detailed description. The drawings that accompany the detailed description can be briefly described as follows.

FIG. 1 illustrates an example of a method of diffusion coating a substrate.

FIG. 2 shows an example of a substrate that is prepared for diffusion coating.

DETAILED DESCRIPTION

Figure 2A:
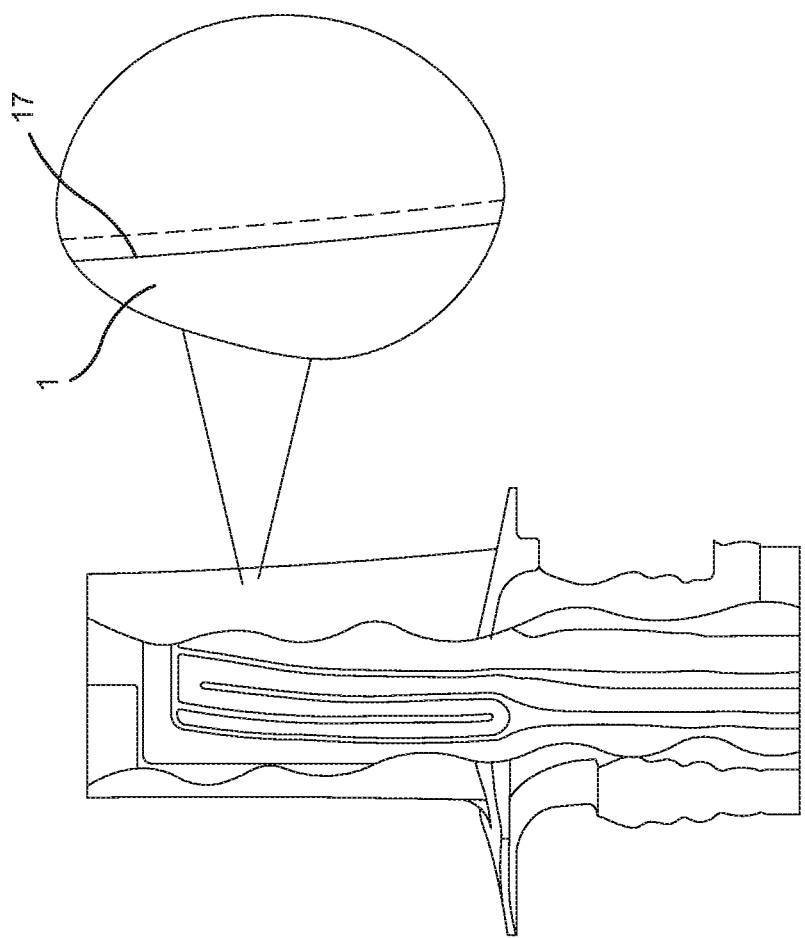
FIG. 2A shows a magnified section of the substrate with a chromium layer.

According to the disclosure, a process is provided for applying a chromium layer on a substrate comprising: contacting at least a portion of the substrate with a vapor comprising a gaseous chromium wherein the gaseous chromium is generated from a mixture comprising a chromium source and a substantially nitrogen free activator.

FIG. 1 illustrates an example of a method of diffusion coating a substrate with a chromium layer, such as a substrate made of a nickel-based superalloy. The method involves the use of the mixture that is tailored to provide an effective chromium diffusion onto the nickel-based superalloy of the substrate without depositing nitrides on said substrate or the deposited chromium layer.

One advantageous embodiment of the mixture can consist essentially of an active coating metal which can be a mixture of chromium, a diffusion activator and a carrier material. For example, the mixture may include only the listed constituents and inadvertent impurities that do not influence the properties of the mixture. The chromium can be of flake or powder form or consistency. In a preferred example chromium (III) chloride, which can be provided in a flake or powder form can be used as the diffusion activator. In another example chromium (II) chloride, which can also be provided in flake or powder form can be used as the diffusion activator.

Other activators, such as other halide-based activators, vary in effectiveness with regard to different active coating metals, including chromium. However, the chromium (III) chloride, in the prescribed amount, is particularly effective for facilitating the diffusion of chromium into nickel-based superalloys without forming nitrides on the resulting layer.

In a further example, the mixture, again relative to the total combined weight, also has 98-99% by weight of chromium.

The amount of chromium (III) chloride diffusion activator and chromium are selected in correspondence, for effective diffusion and area control. The relationship between the amount of the chromium and the amount of the chromium (III) chloride can be represented as a ratio. For instance, mixture, relative to the total combined weight, can include X % by weight of the chromium and Z % by weight of the chromium (III) chloride in a ratio of X/Z that can be between 120:1 and 160:1. Providing the chromium and the chromium (III) chloride in the ratio described ensures effective diffusion of chromium into the substrate and control over the area of the substrate into which chromium diffuses. That is, the mixture herein limits lateral diffusion that would otherwise enlarge the coating area.

A variation of the method can include heating and application steps. As an example, the heating is conducted in an enclosure having a continual flow of a carrying gas that is inert to produce an environment, in which said inert gas is the most abundant gas, at a temperature greater than 1900° F./1038° C., such as 1950° F./1066° C. to 2000° F./1094° C. The mixture can be heated until it starts vaporizing and is able to mix with the carrying gas. In one embodiment of the method, the inert gas used can be Argon.

The application step includes contacting the gaseous mixture to the substrate, such as by introducing the substrate into a chamber filled with the gaseous mixture. Alternatively, by heating the solid form until the solids vaporize to produce the desired gaseous mixture and subsequently feeding the gaseous mixture vapor directionally onto the substrate. In another embodiment of the application the substrate can also be heated prior to coating in order to enhance the reception qualities of the substrate to chromium.

The substrate can be placed in contact with the gas for a selected amount of time, depending upon a desired thickness of the chromium layer. In some examples, the selected amount of time is between 4 and 20 hours and the final chromium diffusion coating (layer) includes at least 20% by weight of chromium. As chloride compounds are contacted with the substrate, the aluminum in the substrate bonds to oxygen to create aluminum oxide and form the desired chromium layer. Thickness of the resulting chromium layer is dependent on the aluminum content of the substrate. In a preferred embodiment of the method, the resulting thickness of the chromium layer is between 0.3 and 1.3 mil (7.62-33.02 microns).

FIG. 2 shows a substrate (1), which in this example is a gas turbine engine turbine blade. It is to be understood, however, that the present method can also beneficially be applied to other substrates or other gas turbine engine components. In this example, the substrate generally includes an airfoil portion (3) and a root portion (5). The airfoil also generally includes internal air passageways (7). In the preferred embodiment of the method the internal passageways also receive a layer of chromium. Further FIG. 2A shows a magnified version of the substrate (1) with a layer of chromium (17) present.

Figure 3:
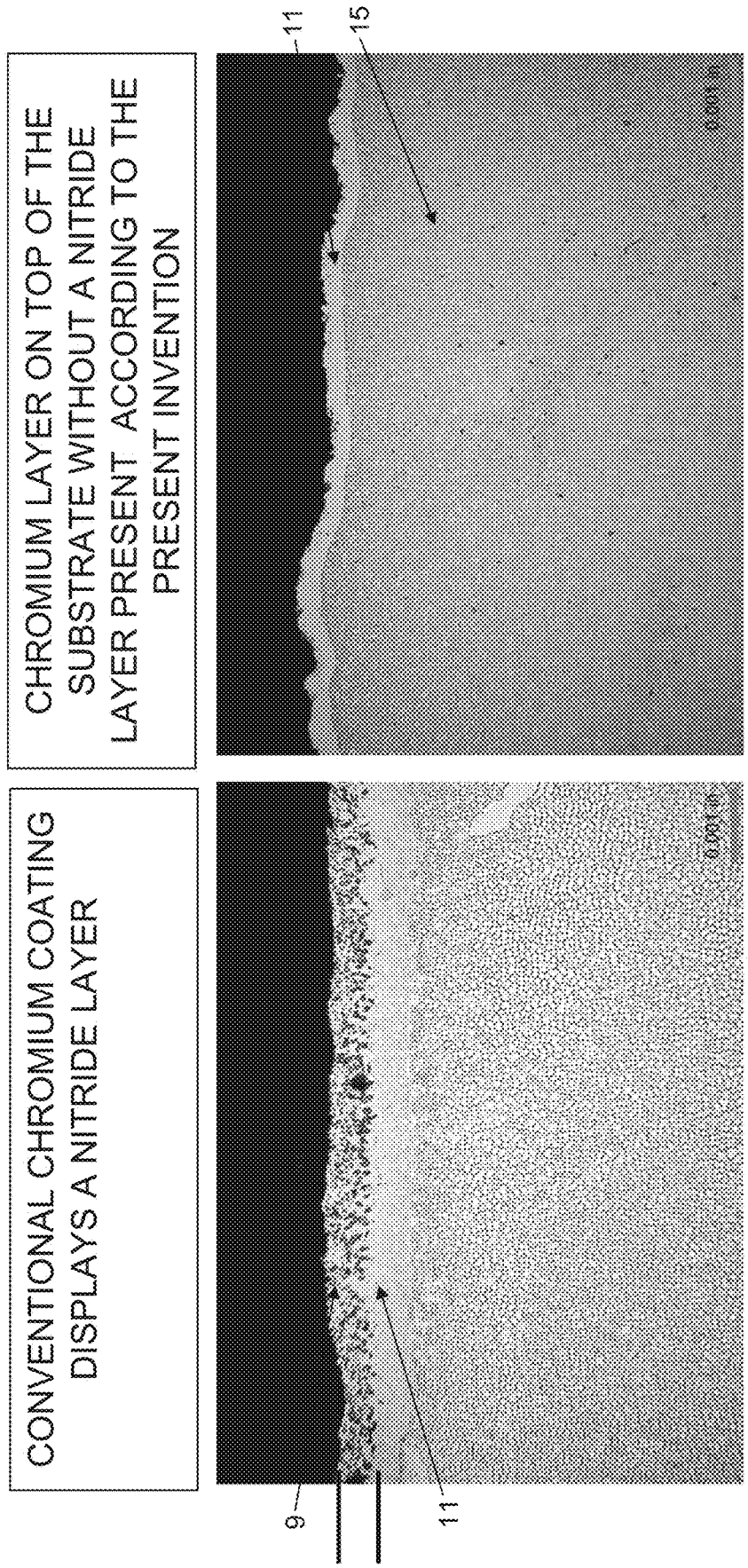
FIG. 3 shows a comparison of the resulting layers of conventional chromium application and the current disclosure, with no nitride layer present in the latter.

FIG. 3 shows a side by side comparison of the resulting layers of chromium, one using the conventional method and the other using the method of the present disclosure. Using the conventional method, the image on the left, the resulting nitride layer (9) on top of the chromium layer (11) can be seen. The image of a substrate coated according to the present disclosure, on the right, shows a chromium layer (11) on top of the substrate (15) with no nitride layer present.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The present disclosure provides a novel and non-obvious method for one or more embodiments of the present disclosure. Variations and modifications to the disclosed examples may become apparent to those skilled in the art that do not necessarily depart from the essence of this disclosure. For example, the exact ratios, enclosure conditions and the initial state of chromium. Accordingly, other embodiments are within the scope of the following claims.

The invention claimed is:

1. A coated substrate, comprising:
a substrate having a surface; and
a chromium layer deposited directly on the surface, and substantially free of nitrides on the chromium layer, wherein the substrate has internal passageways, and the coating is on the internal passageways.

2. The coated substrate of claim 1, wherein the substrate is an aircraft engine airfoil.

3. The coated substrate of claim 1, wherein the substrate is a low pressure turbine stage airfoil.

4. The coated substrate according to claim 1, wherein the chromium layer has a thickness of between 0.3 and 1.3 mils.

5. The coated substrate according to claim 1, wherein the substrate is made of a nickel-based superalloy.

6. A coated substrate, comprising:
a substrate having a surface,
and a chromium layer deposited directly on the surface, and substantially free of nitrides on the chromium layer, wherein the substrate has internal passageways, and the coating is on the internal passageways, wherein the coated substrate is produced by: contacting at least a portion of the substrate with a vapor comprising a gaseous chromium wherein the gaseous chromium is generated from a mixture comprising a chromium source and a substantially nitrogen free activator.

7. The coated substrate according to claim 6, wherein the chromium layer has a thickness of between 0.3 and 1.3 mils.

* * * * *